(12) United States Patent
Wurcer et al.

(10) Patent No.: US 8,134,407 B2
(45) Date of Patent: Mar. 13, 2012

(54) ENHANCING DUAL OP-AMPS FOR DIFFERENTIAL CONNECTIONS

(75) Inventors: Scott A. Wurcer, Cambridge, MA (US); Robert F. Day, Norfolk, MA (US)

(73) Assignee: Analog Devices, Inc., Norwood, MA (US)

( * ) Notice: Subject to any disclaimer, the term of this patent is extended or adjusted under 35 U.S.C. 154(b) by 181 days.

(21) Appl. No.: 12/625,870

(22) Filed: Nov. 25, 2009

(65) Prior Publication Data

US 2011/0121902 A1  May 26, 2011

(51) Int. Cl.
*H03F 3/45* (2006.01)
(52) U.S. Cl. ......................... 330/257; 330/258
(58) Field of Classification Search .............. 330/252, 330/257, 258
See application file for complete search history.

(56) References Cited

U.S. PATENT DOCUMENTS 7,847,633 B2 * 12/2010 Kinget ................ 330/253

* cited by examiner

*Primary Examiner* — Steven J Mottola
(74) *Attorney, Agent, or Firm* — Kenyon & Kenyon LLP

(57) ABSTRACT

In an embodiment of the invention, a differential input signal is coupled to a plurality of transconductance blocks. In some embodiments, each of the transconductance blocks divide an input transconductance among a plurality of signal paths to a plurality of outputs in each transconductance block. In an embodiment, the input transconductance may be divided based a ratio of transistor areas in the plurality of signal paths, though other embodiments may divide the transconductance differently. In some embodiments, transconductance block outputs of a plurality of transconductance blocks may be cross-coupled to provide a gain path for a differential signal than is greater than that of a common mode signal.

18 Claims, 13 Drawing Sheets

500

ENHANCING DUAL OP-AMPS FOR DIFFERENTIAL CONNECTIONS

BACKGROUND

Many electronic systems, such as telecommunications or computing systems, use differential signaling to transmit information electronically. Typically, differential signaling enables information to be transmitted over two complementary signals sent over two separate wires. When a receiving device receives a differential signal, the receiver may decode the signal by comparing the two signals to measure the difference. Differential amplifiers are often used in differential signaling to boost differential signals before transmission.

In boosting the differential signals, differential amplifiers may increase the output range and bandwidth of a signal path. However, some existing differential amplifier designs only provide limited improved output ranges because of other factors, such as common mode stability issues. For example, FIG. 1 shows an existing dedicated differential-in differential-out amplifier. In this example, the input FET transistors M1 to M4 are cross-coupled so that each pair of inputs drive the outputs differentially, or out-of-phase. During this cross-coupling, the common mode input is defined as taking both the positive inputs of a differential amplifier and moving them in phase with each other through transistors M1 and M4, while moving them out of phase with the inverting inputs M2 and M3. Since the drain currents of transistors M1 and M3 are opposite and equal and the drain currents of transistors M2 and M4 are also opposite and equal, there is no net current out of the input stage, which explains the need for a common mode feedback circuit with transistors Mc1-Mc7.

A second existing design is shown in FIG. 2. In FIG. 2, two op-amps 201 and 202 are connected as a differential-in differential-out amplifier. In this circuit, the input common mode voltage $V_{CM}$ flows through the circuit to the output, resulting in a common mode voltage gain of 1. The differential gain is set by the resistor ratio, $G=(1+Rf/Rg)$. However, in certain instances, such as driving a subscriber line or power line network using CMOS digital-to-analog converters operating on low voltage (1.8V-3.3V) supply rails, gains of 5 to 10, or more are needed. Although decompensating the amplifiers 201 and 202 may result in higher close loop bandwidth and lower distortion in these instances, unity gain stability is required in the amplifiers 201 and 202 of this example, preventing the amplifiers 201 and 202 from being decompensated.

A third existing design is based on cross-coupling compensation capacitors to get the benefits of higher closed loop bandwidth and lower distortion. In such a design, the unity gain crossover frequency may be proportional to the product of the inverse input transconductance, $1/G_M$, of amplifier 302 and the compensation capacitance, $C_{comp}$, where the crossover frequency $fc=\frac{1}{2}*\pi*(1/G_M)*C_{comp}$. When a typical op-amp is connected in a closed loop gain of G, it may remain stable as its compensation capacitance is reduced to $(1/G)*C_{comp}$, thereby improving bandwidth, slew-rate, and distortion performance. However, the need to maintain common mode voltage stability requires a higher value of $C_{comp}$, which prevents attainment of these performance improvements. Cross-coupling compensation capacitors circumvents this limitation by providing different compensation capacitances for the common mode and differential signals and therefore two different cross over frequencies. Although providing a larger capacitance for the common mode may preserve unity gain stability, and the smaller differential capacitance may provide increased bandwidth, in some instances it may be desirable to provide broader bandwidth for differential operation while providing lower bandwidth and stability for the common mode signal without manipulating capacitances.

Thus, there is a need for additional devices and methods for enhancing the dynamic range of differential signals while maintaining the stability of common mode signals using dual op-amps without manipulating capacitance.

DETAILED DESCRIPTION

In an embodiment of the invention, two operational amplifier input stages are cross-coupled, with the input transconductance in each transconductance block divided up among two or more signal paths to different transconductance outputs, some of which may be cross-coupled to different transconductance outputs of other transconductance blocks. By cross-coupling the transconductance block outputs, it is possible to generate a net differential signal gm that may be several times greater than gm generated by common mode signals. In an embodiment, the input transconductance may be divided up and weighted by size ratio 1:N or N:1 of the emitter areas of transistors in the transconductance blocks.

Figure 3:
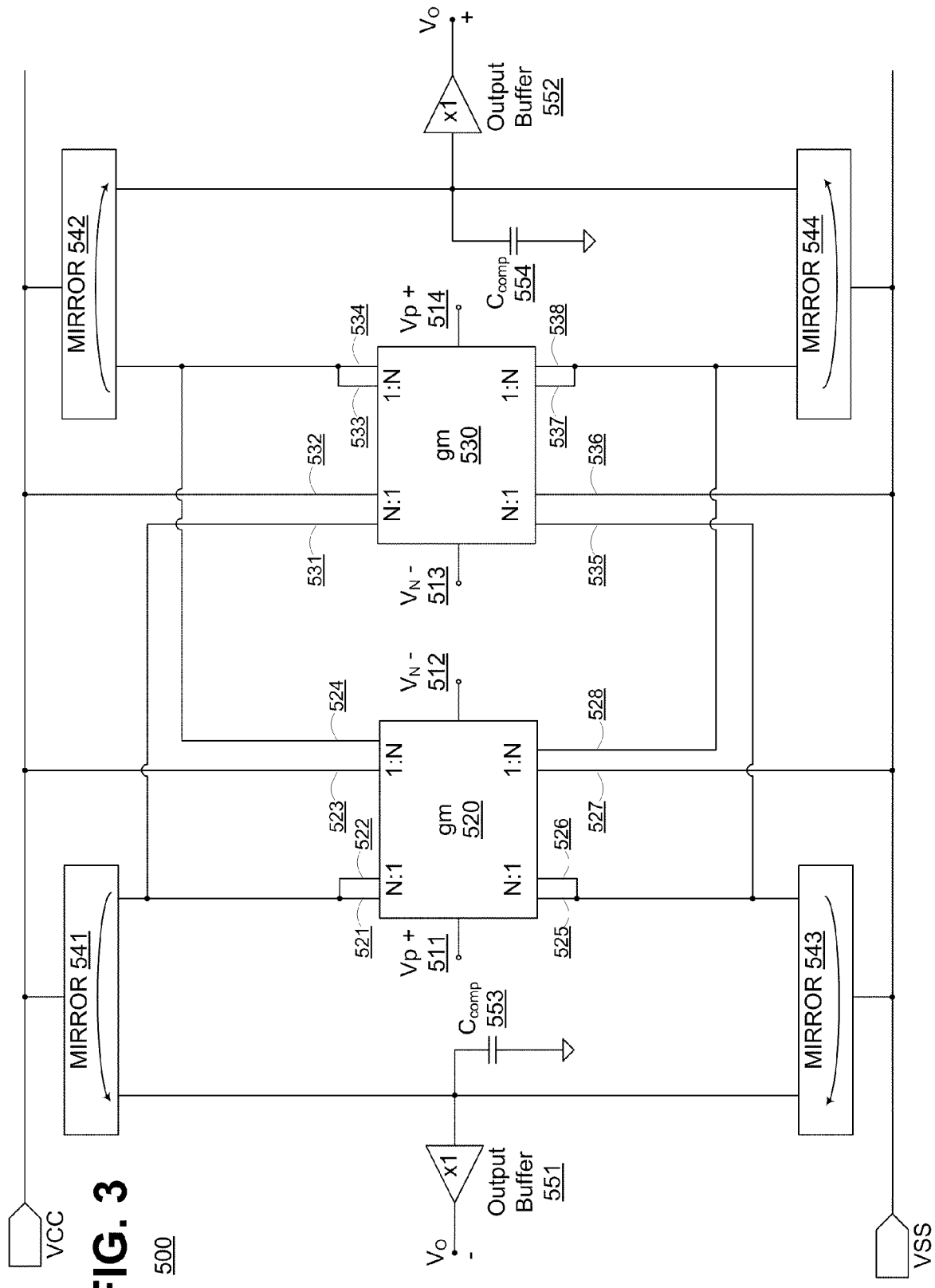
FIG. 3 shows a voltage feedback amplifier circuit in an embodiment of the invention.

FIG. 3 shows a voltage feedback amplifier circuit 500 in an embodiment of the invention. The amplifier circuit may include a pair of transconductance blocks 520, 530 generating several sets of differential currents in response to an applied differential voltage. The amplifier circuit further may include a plurality of current mirrors 541-544 to aggregate currents generated by the transconductance blocks and mirror the currents to respective output buffers 551, 552. Compensation capacitors may be provided at inputs of the output buffers.

In an embodiment, an input signal from differential signal pairs, Vp 511 and Vn 512, and Vn 513 and Vp514, may be input to a plurality of transconductance blocks 520 and 530. In an embodiment, the differential signal on Vp 511 is 180° out of phase with the different signal on Vp 514, while the differential signal on Vn 512 is also approximately 180° out of the phase with the differential signal on Vn 513. A transconductance block 520, 530 generates differential currents on its outputs 521-528, 531-538 based on a differential voltage applied at its inputs 511/512, 513/514. In the embodiment illustrated in FIG. 3, the outputs are shown as weighted output. Thus, a first set of output terminals, for example 521, 524, 525 and 528, generate output currents that are N times that of currents generated at output terminals 522, 523, 526 and 527. The factor N can be tuned for different amplifier topologies and applications.

In some embodiments, the transconductance ratios may be selectable and/or changeable depending on the application. In an embodiment, desired transconductance ratios may be selectable or changeable through hardware or software interfacing with hardware selecting transistors with desired transconductance ratios based on predetermined criteria, such as criteria providing optimized ratios for particular applications. In the embodiment shown in FIG. 3, the transconductance ratio between each of pair of output terminals, such as 521 and 522, 523 and 524, 525 and 526, 527 and 528, 531 and 532, 533 and 534, 535 and 536, 537 and 538, may be selected to be a 1 to N ratio, though in other embodiments other ratios may selected for specific outputs and/or output pairs.

In an embodiment, transconductance outputs 521, 522, and 531 may be coupled to an input of a first current mirror 541, transconductance outputs 533, 534, and 524 may be coupled to an input of a second current mirror 542, transconductance outputs 525, 526, and 535 may be coupled to an input of a third current mirror 543, and transconductance outputs 537, 538, and 528 may be coupled to an input of a fourth current mirror 544. In an embodiment, the remaining transconductance outputs 523, 527, 532, and 536, may be coupled to a supply line or to a ground. In an embodiment, the outputs of current mirrors 541 and 543 may be coupled to an input of output buffer 551 and a capacitor Ccomp 553, whereas the outputs of current mirrors 542 and 544 may be coupled to an input of output buffer 552 and a capacitor Ccomp 554.

Figure 4:
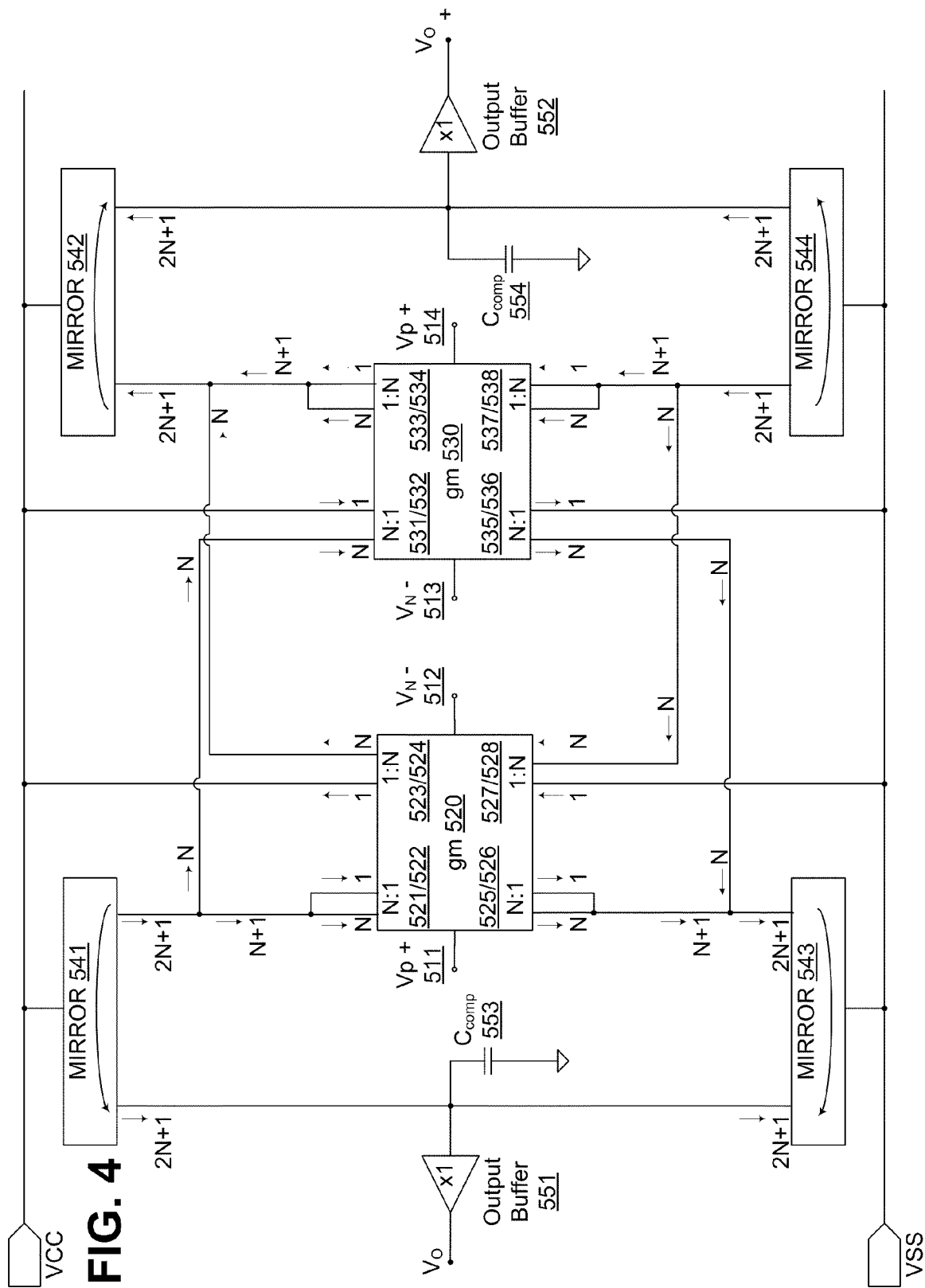
FIG. 4 shows differential signal current flows and values in an exemplary voltage feedback amplifier circuit.

FIG. 4 shows the directional flows and accumulation of differential signal currents in the embodiment shown in FIG. 3. In this embodiment, outputs 523, 524, 525, 526, 533, 534, 535, and 536 output a positive current while outputs 521, 522, 527, 528, 531, 532, 537, and 538 output a negative current. Also in this embodiment, each of outputs 521, 524, 525, 528, 531, 534, 535, and 538 may be configured to output a current that is N times the current outputted by each of the corresponding outputs 522, 523, 526, 527, 532, 533, 536, 537, based, for example, on transistor emitter areas that are N times greater than those of the corresponding outputs.

Since the differential signals at outputs 521, 522, and 531 are coupled together and each emits a negative current, the currents will add, resulting in a current at current mirror 541 that is (2N+1) times as large as the current at output 522. Since the differential signal at outputs 525, 526, and 535 are also coupled together and each emits a positive current, these currents will also add, resulting in a current at current mirror 543 that is (2N+1) times as large as the current at output 526. Thus, the mirrored current at current mirrors 541 and 543 will also be (2N+1) times as large as the current at either outputs 522 or 526.

Since the outputs 533, 534, and 524 are coupled together and each emits a positive current, the currents will add, resulting in a current at current mirror 542 that is (2N+1) times as large as the current at output 533. Since the outputs 537, 538, and 528 are also coupled together and each emits a negative current, these currents will also add, resulting in a current at current mirror 544 that is (2N+1) times as large as the current at output 537. Thus, the mirrored current at current mirrors 542 and 544 will also be (2N+1) times as large as the current at either outputs 533 or 537.

The directional currents for differentially applied signals are shown in FIG. 4 where $Vp511_{Diff}-Vp514_{Diff}$ is the difference between the positive differential voltage input 511 in transconductance block 520 and the negative differential voltage input 514 in transconductance block 530, which is 180° out of phase with input 511. It can be seen that the aggregated current output from the transconductance blocks is (2N+1) gm before being directed into the current mirror, the resulting differential gain-bandwidth product at output buffers 551 and 552 may be approximated by the following formula:

$$GBW_{Diff} = \frac{((2N+1)gm)}{2\pi C_{Comp}} \quad (1)$$

Figure 5:
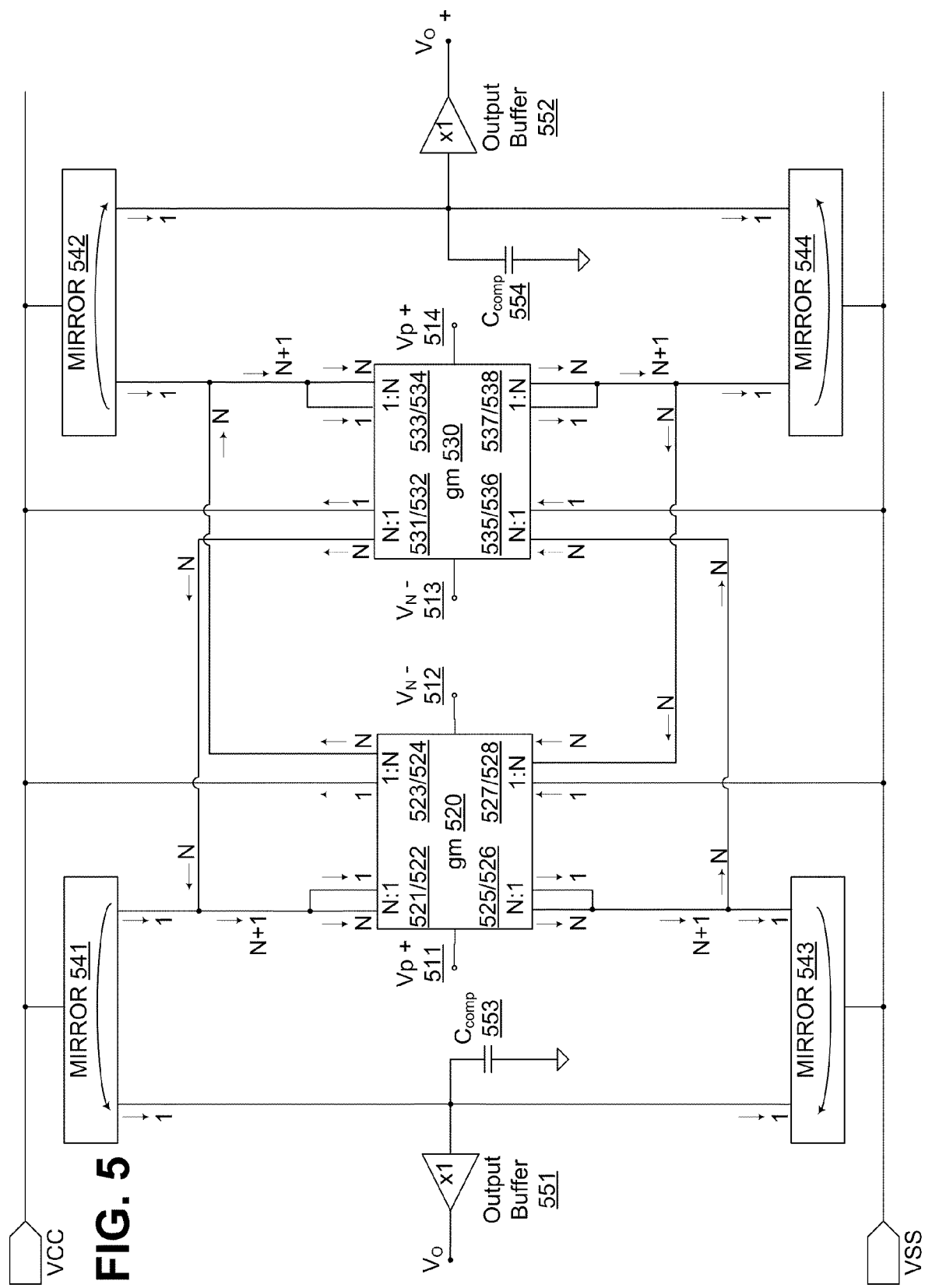
FIG. 5 shows common mode signal current flows and values in an exemplary voltage feedback amplifier circuit.

FIG. 5 shows the directional flows and accumulation of common mode signal currents in the embodiment shown in FIG. 3. In this embodiment, a common mode input signal may be transmitted through inputs Vp 511 in transconductance block 520 and Vp 514 in transconductance block 530. The common mode input signal on Vp 511 may be in phase with the common mode input signal on Vp 514. In an embodiment, the common mode signal in outputs 523, 524, 525, 526, 531, 532, 537, and 538 output a positive current while outputs 521, 522, 527, 528, 533, 534, 535, and 536 output a negative current. Also in this embodiment, each of the output pairs 521/522, 523/524, 525/526, 527/528, 531/532, 533/534, 535/536, 537/538, may have one output configured to output a current that is N times the current outputted by the second output in the pair.

Since the outputs 521, 522, and 531 are coupled together, the currents will add, resulting in a negative current from output 522, since the negative current from output 521 will cancel with the positive current from output 531. Since the outputs 525, 526, and 535 are also coupled together, these currents will also add, resulting in a positive current from output 526, since the positive current from output 525 will cancel with the negative current from output 535. Thus, the common mode signal output at current mirrors 541 and 543 will be substantially smaller than a comparable differential signal output resulting in significantly lower common mode bandwidth.

Since the outputs 533, 534, and 524 are coupled together, the currents will add, resulting in a negative current from output 533, since the negative current from output 534 will cancel with the positive current from output 524. Since the outputs 537, 538, and 528 are also coupled together, these currents will also add, resulting in a positive current from output 537, since the positive current from output 538 will cancel with the negative current from output 528. Thus, the common mode signal output at current mirrors 542 and 544 will be substantially smaller than a comparable differential signal output resulting in significantly lower common mode bandwidth.

The directional currents for the common mode signal are shown in FIG. 5 where $V_{CM}$ is the common mode voltage applied simultaneously to inputs 511 in transconductance block 520 and 514 in transconductance block 530. The resulting common mode gain-bandwidth product may be approximated by the following formula:

$$GBW_{CM} = \frac{(gm)}{2\pi C_{Comp}} \qquad (2)$$

Figure 6:
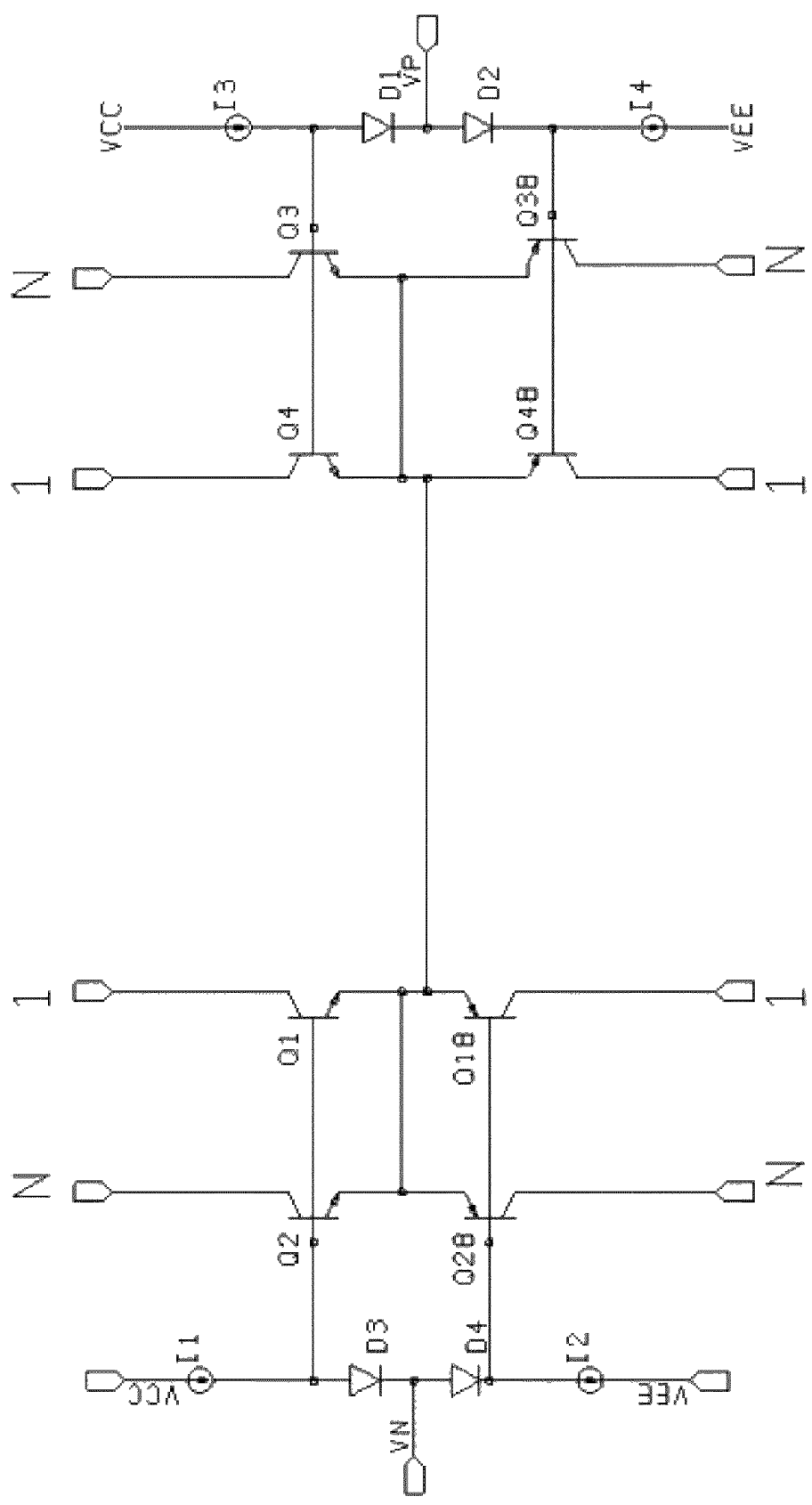
FIG. 6 shows an exemplary configuration of a transconductance block in a voltage feedback amplifier circuit.

FIG. 6 shows an exemplary configuration of a transconductance block, such as transconductance block 530, in a voltage feedback amplifier embodiment. In such an embodiment, the positive differential input signal Vp may be coupled to the cathode of diode D1 and the anode of diode D2. The anode of diode D1 may be coupled to the bases of transistors Q3 and Q4, while the cathode of diode D2 may be coupled to the bases of transistors Q3B and Q4B. The negative differential input signal Vn may be coupled to the cathode of diode D3 and the anode of diode D4. The anode of diode D3 may be coupled to the bases of transistors Q1 and Q2, while the cathode of diode D4 may be coupled to the bases of transistors Q1B and Q2B.

In an embodiment, the emitters of all eight transistors Q1 to Q4 and Q1B to Q4B may be coupled to each other. In an embodiment, the collectors of each of the eight transistors may be coupled to various output terminals of the transconductance block 530. For example, the collector of transistor Q2 may be coupled to output terminal 531, transistor Q1 may be coupled to output terminal 532, transistor Q2B may be coupled to output terminal 535, transistor Q1B may be coupled to output terminal 536, transistor Q4 may be coupled to output terminal 533, transistor Q3 may be coupled to output terminal 534, transistor Q4B may be coupled to output terminal 537, and transistor Q3B may be coupled to output terminal 538.

In an embodiment, the different transconductance values for different output terminals may be obtained by changing the emitter area ratios between different transistors. For example, the emitter areas of transistor Q2 and Q2B may be configured to be N times as a large as the emitter areas of transistors Q1 and Q1B, which will result in a transconductance at output terminals 531 and 535 that is N times as large as the transconductance at output terminals 532 and 536. The same ratios may be applied to transistors Q3 and Q3B and Q4 and Q4B to achieve similar results.

In other embodiments, instead of changing the emitter area ratios, similar results may be obtained by coupling an additional N transistors in parallel to transistors Q2 and Q2B or Q3 and Q3B. As the number of transistors coupled in parallel to these transistors increases, the transconductance at the corresponding output terminals will also increase over transistors Q1 and Q1B and Q4 and Q4B. In some embodiments it may be desirable to dynamically change the transconductance ratios between different output terminals. In these embodiments, the transconductance blocks may include different selectable signal paths, each having a different number of transistors and/or transistors with different emitter surface areas. The desired transconductance ratios between the output terminals for a particular application may be obtained by selecting the signal path containing the appropriate quantity of transistors and/or emitter surface areas to yield the desired ratio.

Figure 7:
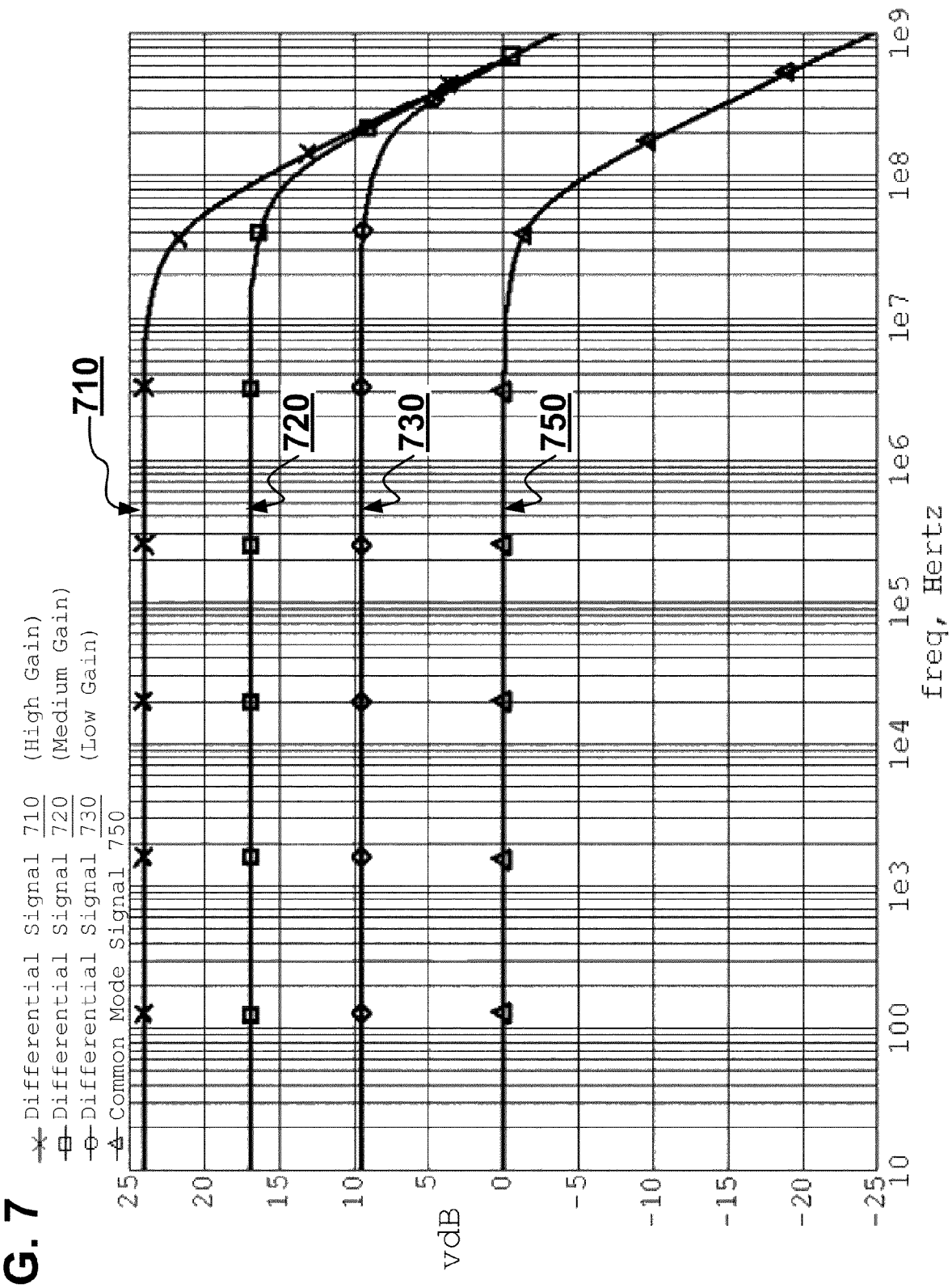
FIG. 7 shows exemplary differential and common mode frequency response curves for a voltage feedback amplifier circuit embodiment.

FIG. 7 shows frequency response curves of exemplary voltage feedback amplifiers having transconductance block configurations shown in FIG. 6. The frequency response curves 710, 720, and 730 represent three differential signal responses, each having closed loop gains that vary based on ratio of the feedback resistor to the gain resistor shown in FIG. 2 according to the differential gain formula G=(1+Rf/Rg). The zero decibel (0 dB) frequency response curve 750 represents the common mode signal which does not change based on varying closed loop gains in differential signals 710, 720, and 730. The common mode frequency response is relatively flat until about 10 MHz, with a cutoff frequency of about 60 MHz, while the differential frequency responses 710, 720, and 730 have a finite gain-bandwidth product that impacts the delta between the differential −3 dB frequency and the common mode −3 dB frequency of this particular embodiment. For example, differential frequency response 710, which has the highest gain is relatively flat until about 7 MHz, with a cutoff frequency of about 40 MHz, whereas differential frequency response 720 with a lower gain is relatively flat until about 18 MHz, with a cutoff frequency of about 100 MHz, and differential frequency response 730 with the lowest gain is relatively flat until about 30 MHz, with a cutoff frequency of about 200 MHz. Thus, the bandwidth difference between the common mode signal and the differential signal varies depending on closed loop gain and finite gain bandwidth product.

Figure 8:
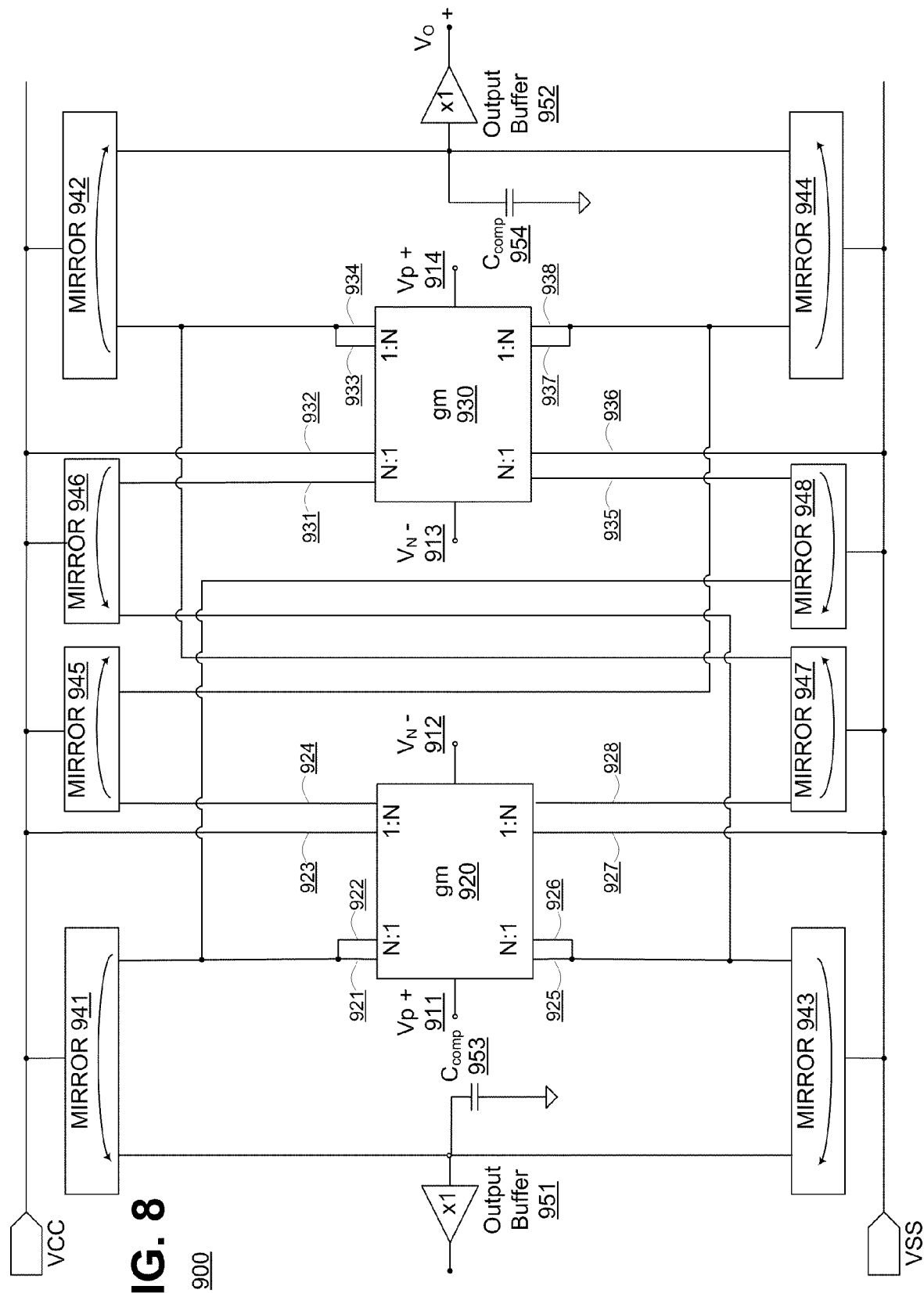
FIG. 8 shows a current feedback amplifier circuit in an embodiment of the invention.

FIG. 8 shows a current feedback amplifier circuit 900 in an embodiment of the invention.

The amplifier circuit may include a pair of transconductance blocks 920 and 930 generating several sets of differential currents in response to an applied differential voltage. The amplifier circuit further may include a plurality of current mirrors 945-948 to mirror currents outputted from a first transconductance block that are cross-coupled to the currents outputted from another transconductance block and a plurality of current mirrors 941 to 944 to aggregate the cross-coupled currents and mirror the currents to the respective output buffers 951, 952. Compensation capacitors may be provided at inputs of the output buffers.

In an embodiment, an input signal from differential signal pairs, Vp 911 and Vn 912, and Vn 913 and Vp 914 may be split and coupled to the inputs of transconductance blocks 920 and 930. In an embodiment, differential signal Vp 911 may be 180° out of phase with differential signal Vp 914, while differential signal Vn 912 may also be approximately 180° out of phase with differential signal Vn 913. A transconductance block 920, 930 generates differential currents on its outputs 921-928 based on a differential voltage applied at inputs 911 and 914. In the embodiment illustrated in FIG. 8, the outputs are shown as weighted output. Thus, a first set of output terminals, for example 921, 924, 925 and 928, generate output currents that are N times that of currents generated at output terminals 922, 923, 926 and 927. The factor N can be tuned for different amplifier topologies and applications.

In an embodiment, transconductance outputs 921 and 922, and current mirror output 948 may be coupled to an input of current mirror 941. In an embodiment, transconductance output 935 may be coupled to the input of current mirror 948 in order to ensure phase and polarity consistency with transconductance outputs 922 and 921. In an embodiment, transconductance outputs 933 and 934, and current mirror output 947 may be coupled to an input of current mirror 942. In an embodiment, transconductance output 928 may be coupled to the input of current mirror 947 in order to ensure phase and polarity consistency with transconductance outputs 933 and 934.

In an embodiment, transconductance outputs 925 and 926, and current mirror output 946 may be coupled to an input of current mirror 943. In an embodiment, transconductance output 931 may be coupled to the input of current mirror 946 in order to ensure phase and polarity consistency with transconductance outputs 925 and 926. In an embodiment, transconductance outputs 937 and 938, and current mirror output 945 may be coupled to an input of current mirror 944. In an embodiment, transconductance output 924 may be coupled to the input of current mirror 945 in order to ensure phase and polarity consistency with transconductance outputs 937 and 938.

In an embodiment, the remaining transconductance outputs 923, 927, 932, and 936, may be coupled to a supply line or to a ground. In an embodiment, the outputs of current mirrors 941 and 943 may be coupled to an input of output buffer 951 and a capacitor Ccomp 953, whereas the outputs of current mirrors 942 and 944 may be coupled to an input of output buffer 952 and a capacitor Ccomp 954.

Figure 9:
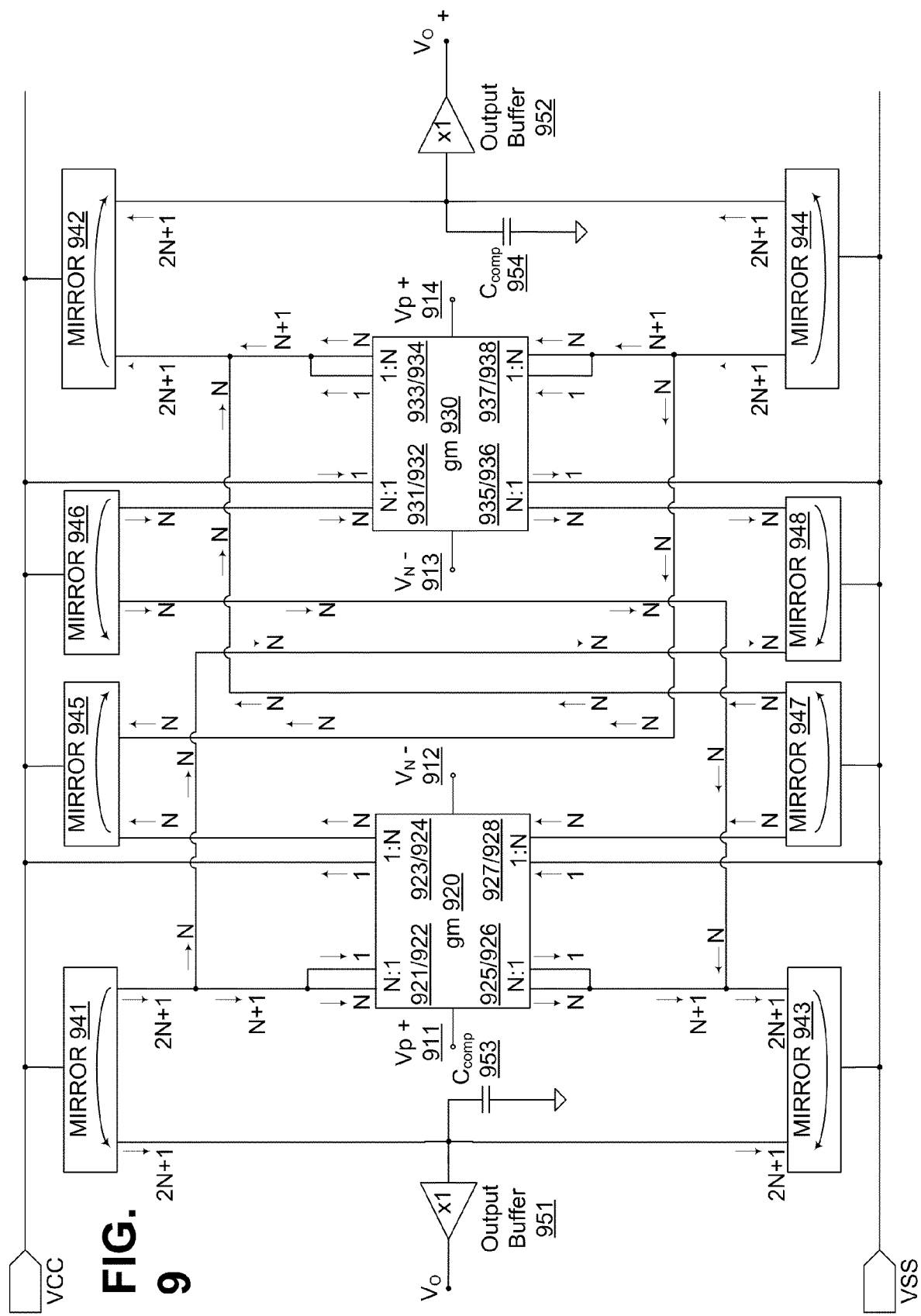
FIG. 9 shows differential signal current flows and values in an exemplary current feedback amplifier circuit.

FIG. 9 shows the directional flows and accumulation of differential signal currents in the embodiment shown in FIG. 8. In this embodiment, outputs 923, 924, 925, 926, 933, 934, 935, and 936 output a positive current while outputs 921, 922, 927, 928, 931, 932, 937, and 938 output a negative current. Also in this embodiment, outputs 921, 924, 925, 928, 931, 934, 935, and 938 may be configured to output a current that is N times the current outputted by corresponding outputs 922, 923, 926, 927, 932, 933, 936, and 937.

Since the outputs 921, 922, and current from output 935 directionally reversed by current mirror 948 are all coupled together, each emitting a negative current, the currents will add, resulting in a negative current at the input of current mirror 941 that is (2N+1) times as large as the current at output 922. Since the outputs 925, 926, and current from output 931 directionally reversed by current mirror 946 are all coupled together, each emitting a positive current, these currents will also add, resulting in a positive current at the input of current mirror 943 that is (2N+1) times as large as the current at output 926. Thus, the output at current mirrors 941 and 943 will also be (2N+1) times as large as the current at either outputs 922 or 926.

Since the outputs 933, 934, and current from output 928 directionally reversed by current mirror 947 are all coupled together, each emitting a positive current, the currents will add, resulting in a positive current at the input of current mirror 942 that is (2N+1) times as large as the current at output 933. Since the outputs 937, 938, and current from output 924 directionally reversed by current mirror 945 are all coupled together, each emitting a negative current, these currents will also add, resulting in a negative current at the input of current mirror 944 that is (2N+1) times as large as the current at output 937. Thus, the output at current mirrors 942 and 944 will also be (2N+1) times as large as the current at either outputs 933 or 937.

The directional currents for differentially applied signals are shown in FIG. 9 where Vp911$_{Diff}$–Vp914$_{Diff}$ is the difference between the positive differential voltage input 911 in transconductance block 920 and the negative differential voltage input 914 in transconductance block 930, which is 180° out of phase with input 911. It is a well known property of current feedback amplifiers that for low gains the bandwidth is constant and Rfb is much greater than re; realizing that the error current is therefore the applied voltage divided by Rfb, to a first order, the differential bandwidth can be approximated by the following formula:

$$BW_{Diff} \cong \frac{\left(\frac{Vp911 - Vp914}{Rfb}\right) \cdot \frac{2N+1}{2N+2}}{2\pi C_{Comp}} \quad (3)$$

Figure 10:
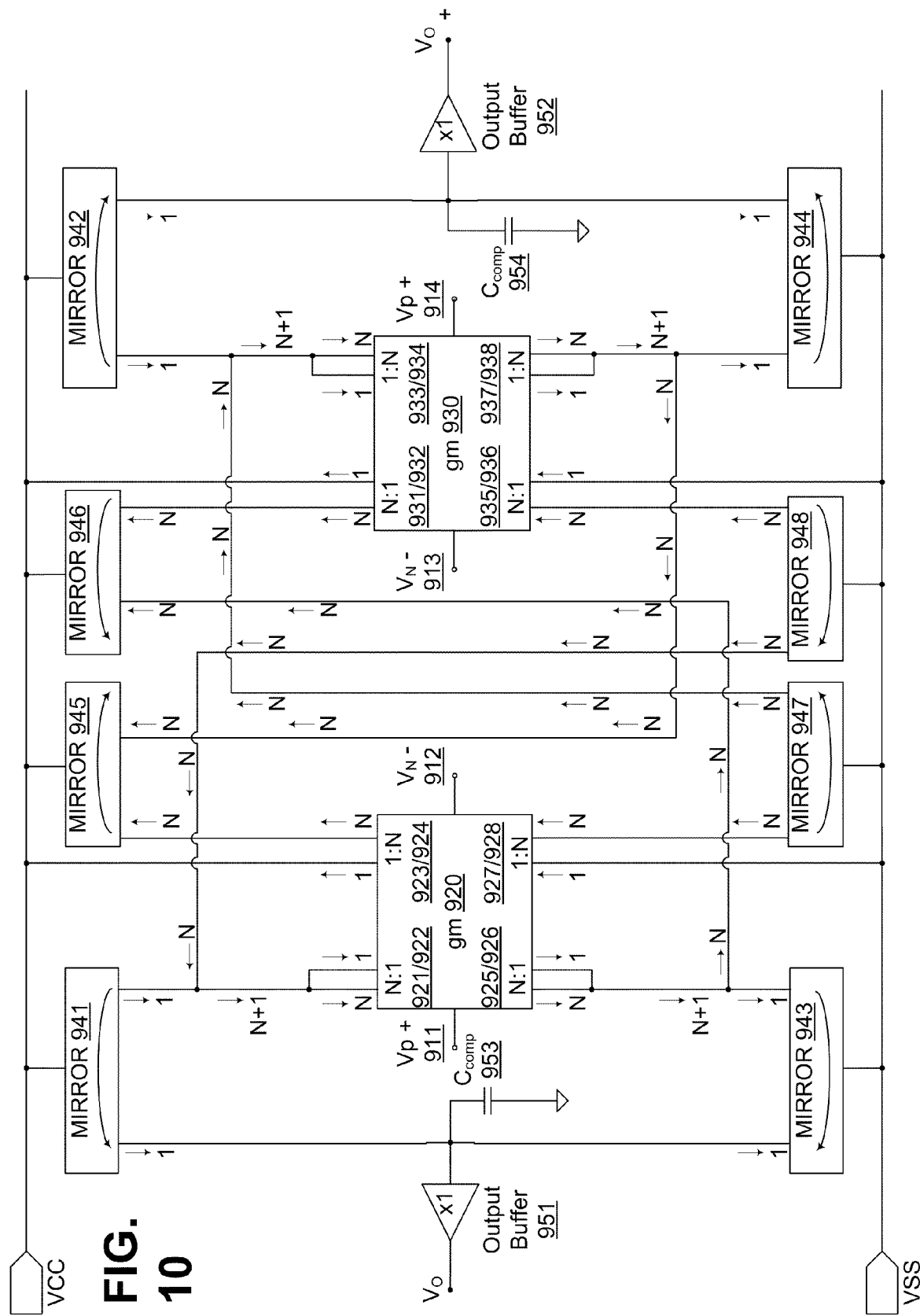
FIG. 10 shows common mode signal current flows and values in an exemplary current feedback amplifier circuit.

FIG. 10 shows the directional flows and accumulation of common mode signal currents in the embodiment shown in FIG. 8. In this embodiment, a common mode input signal may be transmitted through inputs Vp 911 in transconductance block 920 and Vp 914 in transconductance block 930. The common mode input signal in Vp 911 may be in phase with the common mode input signal in Vp 914. In this embodiment, outputs 923, 924, 925, 926, 931, 932, 937, and 938 output a positive current while outputs 921, 922, 927, 928, 933, 934, 935, and 936 output a negative current. Also in this embodiment, outputs 921, 924, 925, 928, 931, 934, 935, and 938 may be configured to output a current that is N times the current outputted by corresponding outputs 922, 923, 926, 927, 932, 933, 936, and 937.

Since the outputs 921, 922, and current from output 935 directionally reversed by mirror 948 are all coupled together, the currents will add, resulting in a negative current from output 922, since the negative current from output 921 will cancel with the positive current from current mirror output 948. Since the outputs 925, 926, and current from output 931 directionally reversed by mirror 946 are all coupled together, these currents will also add, resulting in a positive current from output 926, since the positive current from output 925 will cancel with the negative current from current mirror 946 output. Thus, the common mode signal output at current mirrors 941 and 943 will only have unit weighting.

Since the outputs 933, 934, and current from output 928 directionally reversed by current mirror 947 are all coupled together, the currents will add, resulting in a negative current from output 933, since the negative current from output 934 will cancel with the positive current from current mirror 947 output. Since the outputs 937, 938, and current from output 924 directionally reversed by current mirror 945 are all coupled together, these currents will also add, resulting in a positive current from output 937, since the positive current from output 938 will cancel with the negative current from current mirror 945 output. Thus, the common mode signal output at current mirrors 942 and 944 will also have unit weighting.

The directional currents for the common mode signal shown in FIG. 10 may be used to calculate the common mode bandwidth generated at the output of the circuit. The common mode bandwidth can be approximated by the following formula, where $V_{CM}$ is the common mode voltage applied simultaneously to inputs 911 and 914:

$$BW_{CM} \cong \frac{\left(\frac{Vcm}{Rfb}\right) \cdot \frac{1}{2N+2}}{2\pi \cdot C_{Comp}} \quad (4)$$

Figure 11:
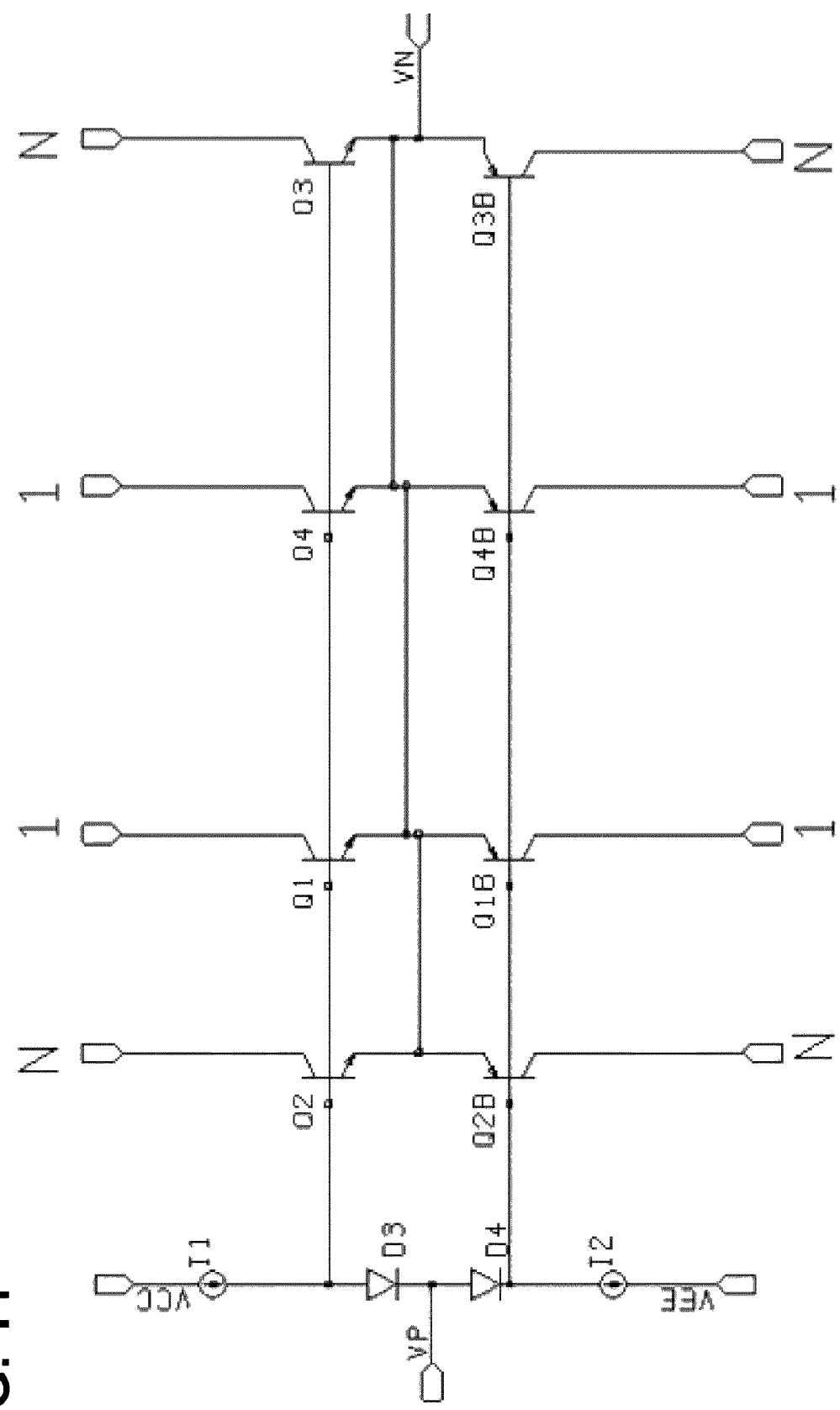
FIG. 11 shows an exemplary configuration of a transconductance block in a current feedback amplifier circuit.

FIG. 11 shows an exemplary configuration of a transconductance block, such as transconductance block 920, in a current feedback amplifier embodiment. In such an embodiment, the positive differential input signal Vp may be coupled to the cathode of diode D3 and the anode of diode D4. The anode of diode D3 may be coupled to the bases of transistors Q1 to Q4, while the cathode of diode D4 may be coupled to the bases of transistors Q1B to Q4B. The negative differential input signal Vn may be coupled to the emitters of all eight transistors Q1 to Q4 and Q1B to Q4B, which may be all coupled to each other.

In an embodiment, the collectors of each of the eight transistors may be coupled to various output terminals of the transconductance block 920. For example, the collector of transistors: Q2 may be coupled to output terminal 921, Q1 may be coupled to output terminal 922, Q2B may be coupled to output terminal 925, Q1B may be coupled to output terminal 926, Q4 may be coupled to output terminal 923, Q3 may be coupled to output terminal 924, Q4B may be coupled to output terminal 927, and Q3B may be coupled to output terminal 928.

In an embodiment, the different transconductance values for different output terminals may be obtained by changing the emitter area ratios between different transistors. For example, the emitter areas of transistor Q2 and Q2B may be configured to be N times as a large as the emitter areas of transistors Q1 and Q1B, which will result in a transconductance at output terminals 921 and 925 that is N times as large as the transconductance at output terminals 922 and 926. The same ratios may be applied to transistors Q3 and Q3B and Q4 and Q4B to achieve similar results.

In other embodiments, instead of changing the emitter area ratios, similar results may be obtained by coupling an additional N transistors in parallel to transistors Q2 and Q2B or Q3 and Q3B. As the number of transistors coupled in parallel to these transistors increases, the transconductance at the corresponding output terminals will also increase over transistors Q1 and Q1B and Q4 and Q4B. In some embodiments it may be desirable to dynamically change the transconductance ratios between different output terminals. In these embodiments, the transconductance blocks may include different selectable signal paths, each having a different number of transistors and/or transistors with different emitter surface areas. The desired transconductance ratios between the output terminals for a particular application may be obtained by selecting the signal path containing the appropriate quantity of transistors and/or emitter surface areas to yield the desired ratio.

Figure 12:
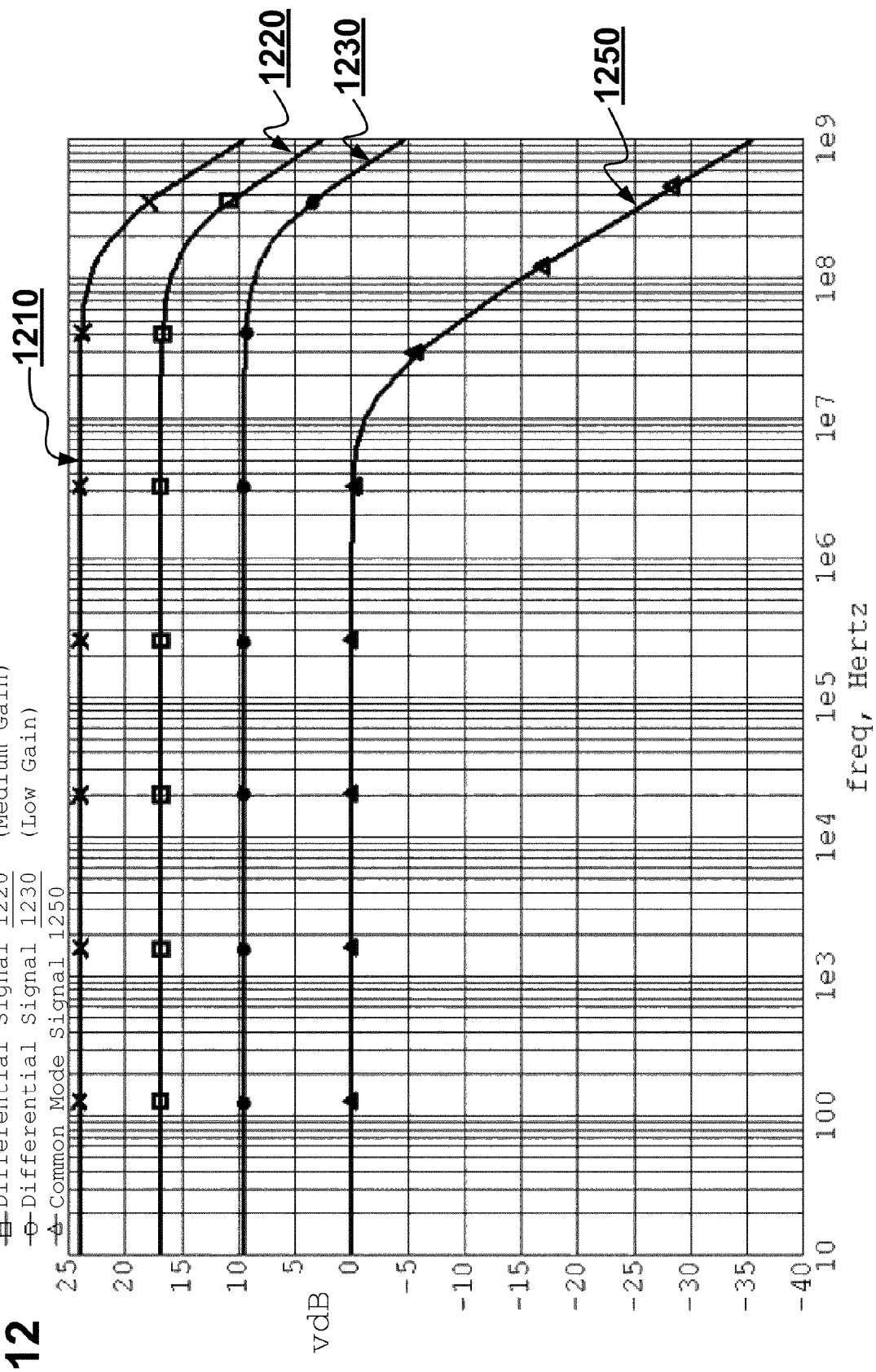
FIG. 12 shows exemplary differential and common mode frequency response curves for a current feedback amplifier circuit embodiment.

FIG. 12 shows frequency response curves of exemplary current feedback amplifiers having transconductance block configurations shown in FIG. 11. The frequency response curves 1210, 1220, and 1230 represent three differential signal responses, each having closed loop gains that vary based on ratio of the feedback resistor to the gain resistor shown in FIG. 2 according to the differential gain formula G=(1+Rf/Rg). The zero decibel (0 dB) frequency response curve 1250 represents the common mode signal which does not change based on varying closed loop gains in differential signals 1210, 1220, and 1230. The common mode frequency response 1250 is relatively flat until about 5 MHz, with a cutoff frequency of about 17 MHz, while the differential frequency responses 1210, 1220, and 1230 are all relatively flat until about 50 MHz, with a cutoff frequency of about 200 MHz. In this current feedback amplifier embodiment, the bandwidth of the differential signal is about 10 times greater than the bandwidth of the common mode signal, regardless of the change in gain. Thus, the bandwidth difference between the common mode signal and the differential signal in the current feedback amplifier embodiment remains unchanged regardless of closed loop gain.

Figure 13:
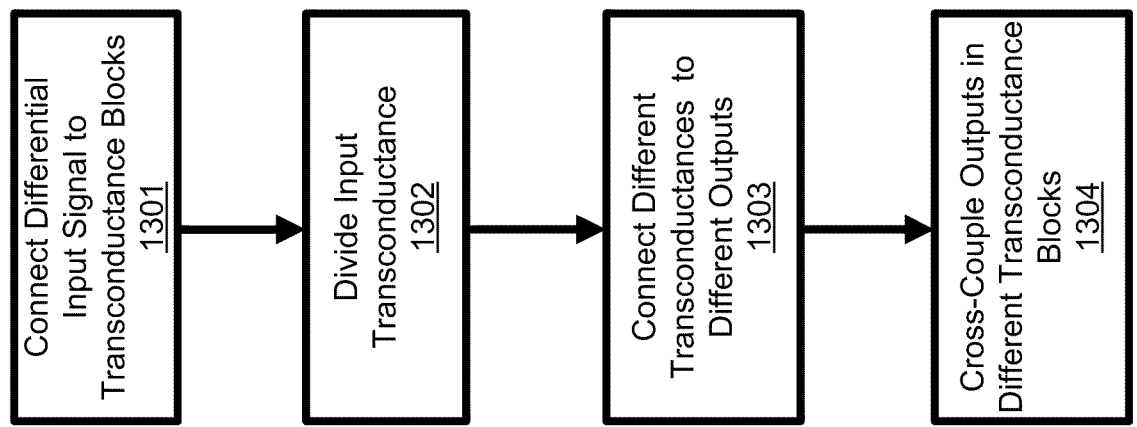
FIG. 13 shows a method of enhancing operational amplifiers in an embodiment.

FIG. 13 shows a method of enhancing operational amplifiers in an embodiment. In step 1301, a differential input signal may be coupled to the inputs of two or more transconductance blocks.

In step 1302, the input transconductance of each block may be divided among different signal paths so that different signal paths may provide different transconductances. For example, in an embodiment the differential signal paths in each transconductance block may be configured to provide one of two transconductances that vary from each other based on a 1 to N ratio. In other embodiments, the transconductance blocks may have multiple transconductance values, which, in some embodiments, may vary between transconductance blocks. In some embodiments, the transconductance value and/or ratios may vary depending on the configuration of each transconductance block. In some embodiments, the signal path and/or transconductance values may be selectable and/or optimized for different applications. In some embodiments, the input transconductance may be divided among different signal paths by varying the transistor areas, such as the emitter areas, of transistors in one signal path over another. In some embodiments, the input transconductance may be divided among different signal paths by coupling additional transistors in parallel in one signal path over another. In some embodiments, other techniques for dividing transconductance may be used.

Once the input transconductance has been divided among two or more signal paths, the two or more signal paths may be coupled to different outputs of each transconductance block in step 1303. In some embodiments, the signal paths that are connected to different outputs may vary depending on the application. In some embodiments, the signal paths connected to the different outputs may be optimized for a particular purpose. In some embodiments, the signal paths connected to different outputs may be switchable.

Figure 1:
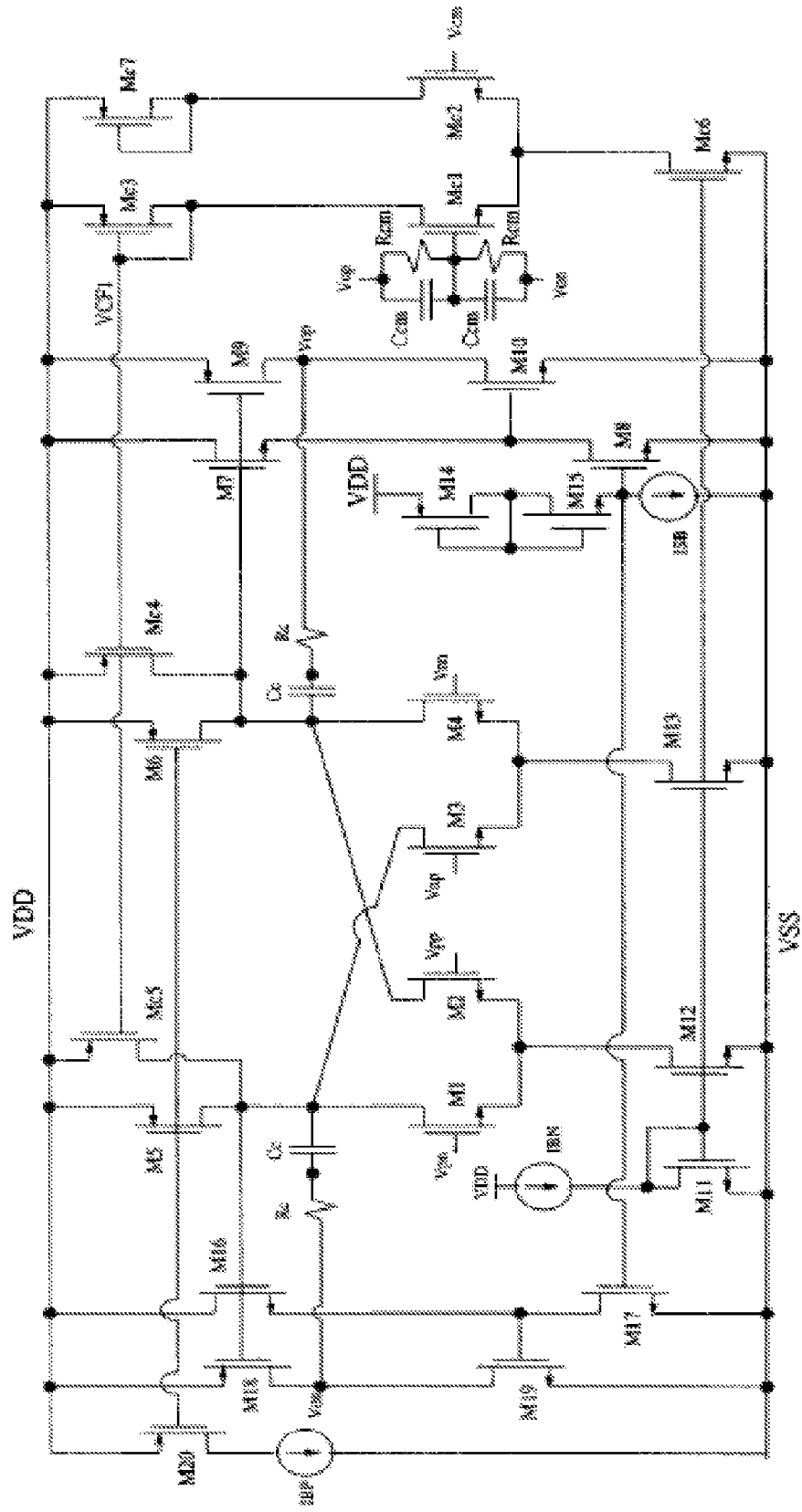
FIG. 1 shows a dedicated differential-in differential-out amplifier.
Figure 2:
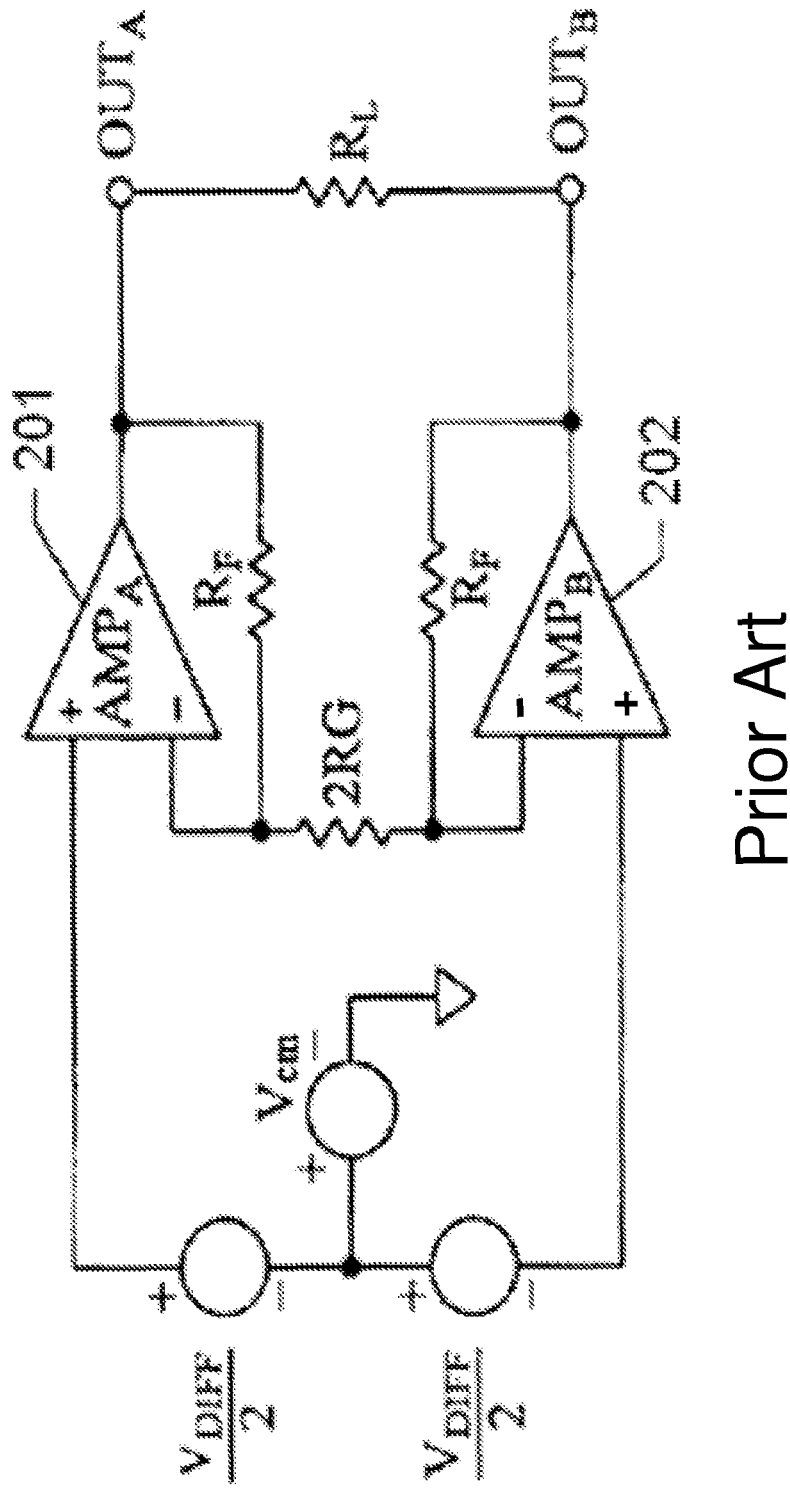
FIG. 2 shows two op-amps connected as a differential-in differential-out amplifier.

Once the two or more signal paths have been coupled to different outputs of each transconductance block, the output (s) of each transconductance block may be cross-coupled with the output(s) of other transconductance block(s) in step 1304. In an embodiment, the cross-coupling of the outputs of two or more transconductance blocks may provide higher transconductance for differential signals and lower transconductance for common mode signals in a differential line driver circuit embodiment such as shown in FIG. 2.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention.

We claim:

1. An amplifier circuit comprising:
    a plurality of transconductance blocks, each transconductance block having inputs for a differential input signal and outputs for differential currents, the transconductance blocks distributing a respective transconductance gain distribution across their outputs according to a predetermined unequal distribution ratio, and
    a plurality of current mirrors, the inputs of the current mirrors coupled to the mutually interconnected outputs of the transconductance blocks and an output of each current mirror coupled to an output buffer and a capacitor;
    wherein outputs of the transconductance blocks are mutually interconnected to provide, at outputs of the amplifier circuit, a differential signal bandwidth and transconductance that is greater than a common mode bandwidth and transconductance.

2. The circuit of claim 1, further comprising additional current mirrors coupled between different mutually interconnected transconductance block outputs.

3. The circuit of claim 1, wherein the transconductance blocks further comprise a plurality of transistors with different emitter areas to distribute the transconductance gain.

4. The circuit of claim 3, wherein the plurality of transistors are structured into pairs, each pair of transistors having a similar fixed emitter area ratio.

5. The circuit of claim 3, further comprising a switchably enabled selector of the transistor(s) having a desired emitter area in the differential signal gain path.

6. The circuit of claim 1, wherein the transconductance blocks further comprise a plurality of transistors are coupled in parallel to distribute the transconductance gain.

7. The circuit of claim 6, wherein the plurality of transistors are structured into groups, each group of transistors having a different number of transistors coupled in parallel.

8. The circuit of claim 6, further comprising a switchably enabled selector of a quantity of transistors coupled in parallel in the differential signal gain path.

9. The circuit of claim 1, wherein each transconductance block further comprises:
- a positive differential signal input coupled, though a first diode, to a base of a first and second transistor, and, through a second diode, to a base of a third and fourth transistor;
- a negative differential signal input coupled, though a third diode, to a base of a fifth and sixth transistor, and, through a fourth diode, to a base of a seventh and eighth transistor; wherein,
- each transistor emitter is coupled together, and
- each transistor collector is coupled to a different output.

10. The circuit of claim 9, wherein:
- the positive differential signal input is coupled to a cathode of the first diode and an anode of the second diode, an anode of the first diode is coupled to the base of the first and second transistors, and a cathode of the second diode is coupled to the base of the third and fourth transistors; and
- the negative differential signal input is coupled to a cathode of the third diode and an anode of the fourth diode, an anode of the third diode is coupled to the base of the fifth and sixth transistors, and a cathode of the fourth diode is coupled to the base of the seventh and eighth transistors.

11. The circuit of claim 9, wherein the emitter areas of the first, third, fifth, and seventh transistors are a number of times greater than the emitter areas of the second, fourth, sixth, and eighth transistors.

12. The circuit of claim 1, wherein each transconductance block further comprises:
- a positive differential signal input coupled, though a first diode, to a base of a first, second, third, and fourth transistor, and, through a second diode, to a base of a fifth, sixth, seventh, and eighth transistor; and
- a negative differential signal input coupled to each transistor emitter; wherein,
- each transistor emitter is coupled together, and
- each transistor collector is coupled to a different output of the plurality of outputs.

13. The circuit of claim 12, wherein the positive differential signal input is coupled to a cathode of the first diode and an anode of the second diode, an anode of the first diode is coupled to the base of the first, second, third, and fourth transistors, and a cathode of the second diode is coupled to the base of the fifth, sixth, seventh, and eighth transistors.

14. The circuit of claim 12, wherein the emitter areas of the first, third, fifth, and seventh transistors are a number of times greater than the emitter areas of the second, fourth, sixth, and eighth transistors.

15. The circuit of claim 1, wherein the outputs of the transconductance blocks are mutually interconnected to provide a common mode gain path of unity and a differential signal gain path greater than unity.

16. A method comprising:
- coupling a differential input signal to a differential input of a plurality of transconductance blocks;
- dividing an input transconductance from the differential input signal into a plurality of transconductances;
- directing the plurality of transconductances to different outputs of the transconductance block;
- cross-coupling at least one output of each transconductance block to at least one output of another transconductance block, the cross-coupling providing a differential signal bandwidth and transconductance that is greater than a common mode bandwidth and transconductance;
- coupling the at least one output of each transconductance block coupled to the at least one output of another transconductance block to an input of a current mirror; and
- coupling an output of the current mirror to a capacitor and an input of an output buffer.

17. An amplifier circuit comprising:
a plurality of transconductance blocks, each transconductance block including:
- inputs for a differential input signal,
- outputs for differential currents,
- a plurality of transistors with different emitter areas to distribute a transconductance gain distribution across the outputs according to a predetermined unequal distribution ratio, and
- a switchably enabled selector of at least one of the transistors having a desired emitter area in a differential signal gain path;
wherein outputs of the transconductance blocks are mutually interconnected to provide, at outputs of the amplifier circuit, a differential signal bandwidth and transconductance that is greater than a common mode bandwidth and transconductance.

18. An amplifier circuit comprising:
a plurality of transconductance blocks, each transconductance block including:
- inputs for a differential input signal,
- outputs for differential currents,
- a plurality of transistors coupled in parallel to distribute a transconductance gain distribution across the outputs according to a predetermined unequal distribution ratio, and
- a switchably enabled selector of a quantity of the transistors coupled in parallel in a differential signal gain path;
wherein outputs of the transconductance blocks are mutually interconnected to provide, at outputs of the amplifier circuit, a differential signal bandwidth and transconductance that is greater than a common mode bandwidth and transconductance.

* * * * *